(12) United States Patent
Tsai et al.

(10) Patent No.: US 7,459,903 B1
(45) Date of Patent: Dec. 2, 2008

(54) MULTI-LEVEL VOLTAGE DETECTION CIRCUIT

(75) Inventors: Sheng-Yuan Tsai, Taipei (TW); Ding-Houng Wang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/984,947

(22) Filed: Nov. 26, 2007

(51) Int. Cl.
*G01R 31/28* (2006.01)

(52) U.S. Cl. .................................... 324/158.1
(58) Field of Classification Search ................ 324/72.5, 324/133, 158.1, 537, 649, 765, 770; 331/44, 331/57, 65; 340/635, 657–661, 664; 327/74–76
See application file for complete search history.

(56) References Cited

U.S. PATENT DOCUMENTS

| | | | | |
|---|---|---|---|---|
| 5,272,445 A | * | 12/1993 | Lloyd et al. | 324/706 |
| 5,557,207 A | * | 9/1996 | Duve | 324/414 |
| 5,656,944 A | * | 8/1997 | Choi | 324/763 |
| 5,939,874 A | * | 8/1999 | Duley | 324/96 |
| 6,255,864 B1 | * | 7/2001 | Culca | 327/78 |

* cited by examiner

*Primary Examiner*—Ha Tran T Nguyen
*Assistant Examiner*—Trung Q Nguyen
(74) *Attorney, Agent, or Firm*—Muncy, Geissler, Olds & Lowe, PLLC

(57) ABSTRACT

A multi-level voltage detection circuit includes the comparators, the first resistors, the power signal input port and the or-gate. The first resistors and the power signal input port are electrically connected to the comparators. The or-gate is electrically connected to the outputs of the comparators. The or-gate outputs the power good signal according to the comparing result of the comparators.

8 Claims, 4 Drawing Sheets

| A | B | C | PGD |
|---|---|---|---|
| 0 | 0 | 0 | 0 |
| 0 | 0 | 1 | 1 |
| 0 | 1 | 0 | X |
| 0 | 1 | 1 | 0 |
| 1 | 0 | 0 | X |
| 1 | 0 | 1 | X |
| 1 | 1 | 0 | X |
| 1 | 1 | 1 | 1 |

Fig. 1A

| A\BC | 00 | 01 | 11 | 10 |
|---|---|---|---|---|
| 0 | 0 | 1 | 0 | X |
| 1 | X | X | 1 | X |

Fig. 1B

| A | B | C | D | PGD |
|---|---|---|---|---|
| 0 | 0 | 0 | 0 | 0 |
| 0 | 0 | 0 | 1 | 1 |
| 0 | 0 | 1 | 0 | X |
| 0 | 0 | 1 | 1 | 0 |
| 0 | 1 | 0 | 0 | X |
| 0 | 1 | 0 | 1 | X |
| 0 | 1 | 1 | 0 | X |
| 0 | 1 | 1 | 1 | 1 |
| 1 | 0 | 0 | 0 | X |
| 1 | 0 | 0 | 1 | X |
| 1 | 0 | 1 | 0 | X |
| 1 | 0 | 1 | 1 | X |
| 1 | 1 | 0 | 0 | X |
| 1 | 1 | 0 | 1 | X |
| 1 | 1 | 1 | 0 | X |
| 1 | 1 | 1 | 1 | 0 |

Fig. 3A

| AB\CD | 00 | 01 | 11 | 10 |
|---|---|---|---|---|
| 00 | 0 | 1 | 0 | X |
| 01 | X | X | 1 | X |
| 11 | X | X | 0 | X |
| 10 | X | X | X | X |

Fig. 3B

MULTI-LEVEL VOLTAGE DETECTION CIRCUIT

BACKGROUND

1. Field of Invention

The present invention relates to a multi-level voltage detection circuit. More particularly, the present invention relates to a multi-level voltage detection circuit of a mother board.

2. Description of Related Art

The power supply unit starts a self-testing process while the computer starts. When the current volume and the signal voltage reach a pre-determined level, the power supply unit issues a power good signal to acknowledge the mother board. The microprocessor keeps resetting until the timing control unit of the microprocessor receives the power good signal.

The conventional power supply unit usually provides a power signal of only one voltage level, and the mother board is acknowledged when the power signal has reached that voltage level. However, the motherboard cannot tell weather the power signal has reached the desired voltage when the power supply unit provides a power signal of more then one voltage level.

For the forgoing reasons, there is a need for a new detection circuit which can acknowledge the mother board that the power signal has reached the desired voltage level while the power supply provides multi-level voltages.

SUMMARY

According to one embodiment of the present invention, a multi-level voltage detection circuit includes a plurality of comparators, a plurality of first resistors electrically connected to the comparators, a power signal input port electrically connected to the comparators, and an or-gate electrically connected to the comparators. The or-gate has an output terminal outputting a first power good signal according to comparative results of the comparators.

According to another embodiment of the present invention, a multi-level voltage detection circuit includes a resistor circuit, a first comparator, a second comparator, a third comparator, and an or-gate. The resistor circuit includes a first resistor, a second resistor, a third resistor, and a fourth resistor electrically connected serially for dividing a reference voltage to generate a first voltage level, a second voltage level and a third voltage level.

The first comparator is electrically connected to the first resistor and the second resistor for comparing an input voltage and the first voltage level. The second comparator is electrically connected to the second resistor and the third resistor for comparing the input voltage and the second voltage level. The third comparator is electrically connected to the third resistor and the fourth resistor for comparing the input voltage and the third voltage level. The or-gate is electrically connected to the first comparator, the second comparator, and the third comparator, in which the or-gate generates a first power good signal according to comparative results of the first, the second, and the third comparators.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 1A shows the truth table of the power good signal according to one embodiment of the present invention;

FIG. 1B shows the Karnaugh map of power good signal according to the embodiment of the present invention;

FIG. 3A shows the truth table of the power good signal according to another embodiment of the present invention;

FIG. 3B shows the Karnaugh map of power good signal according to the embodiment of the present invention;

DESCRIPTION OF THE PREFERRED EMBODIMENTS

Figure 2:
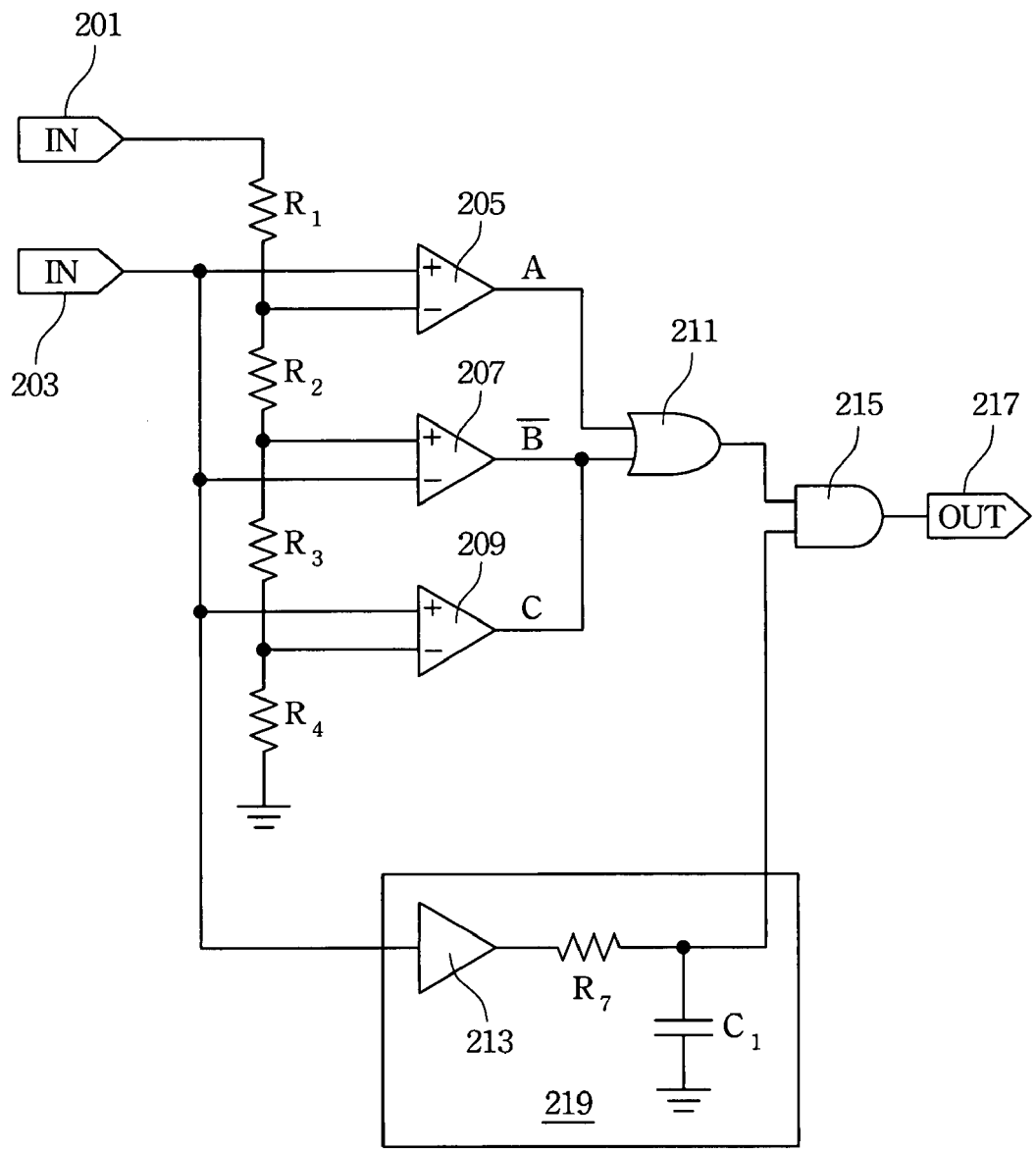
FIG. 2 shows the multi-level voltage detection circuit according to the embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The multi-level voltage detection circuit of the embodiments shown below can detect if the power signal has reached one of the multiple desired voltage level.

FIG. 1A shows the truth table of the power good signal according to one embodiment of the present invention. In the truth table, A, B, C equal to 0, 0, 1, means the power signal has reached the first voltage level, and thus the power good signal is logic 1. A, B, C equal to 1, 1, 1 means the power signal has reached the second voltage level, and the power good signal is also logic 1. On the contrary, A, B, C equal to 0, 0, 0, represents that the power signal has not reached the first voltage level, and the power good signal is logic 0. A, B, C equal to 0, 1, 1, represents that the power signal is greater than the first voltage level but has not reached the second voltage level yet, and the power good signal is also logic 0. The other combinations of A, B and C are not concerned (don't care; X), hence can be arbitrarily set to logic 0 or logic 1.

FIG. 1B shows the Karnaugh map of power good signal of the present invention. In this Karnaugh map, the first column represents the value of A, the first row represents the values of B and C. Other fields in the Karnaugh map represents the values of the power good signal. To simplify the logic circuits of the power good signal, some Xs (don't care) in the Karnaugh map value are set to 1. Therefore, the boolean function of the power good signal is $A+\overline{B}C$.

FIG. 2 shows the multi-level voltage detection circuit according to the embodiment of the present invention. The detection circuit of the power good signal includes the first resistor R1, the second resistor R2, the third resistor R3, the fourth resistors R4, the reference voltage input port 201, the power signal input port 203, and output port 217. The Reference voltage input port 201 inputs a reference voltage. The resistors R1, R2, R3 and R4 are in series connection for dividing the reference voltage to generate the first voltage, the second voltage level and the third voltage level. Or-gate 211 outputs the power good signal, this power good signal is passed to the and-gate 215 and the output port 217.

As shown in FIG. 2, the positive and negative input terminals of the first comparator 205, the second comparator 207, and the third comparator 209 are electrically connected to the power signal input port 203 and the corresponding resistors R1, R2, R3, R4 for comparing the first voltage level, the second voltage level, the third voltage level and the power signal, and generating the A, $\overline{B}$, C accordingly. The or-gate 211 is electrically connected to the three comparators. Hence, if at least one of the three signal A, $\overline{B}$, C is logic 1, the power good signal which is the output signal of the or-gate 211 is logic 1.

If the power signal is scheduled to the second voltage level, the power good signal should be logic 1 only after the power signal has passed through the first voltage level and reached the second voltage level. However, when the power signal has risen to the first logic level but has not reached the second voltage level, the power good signal which is the output of the or-gate 211 may still output logic 1, which makes the motherboard mistakenly believe that the power signal has risen to the second voltage level. Therefore, the delay circuit 219 and the and-gate 215 are added in order to prevent the motherboard from mistakenly regarding the first voltage level as the second voltage level. The delay circuit 219 and the and-gate 215 make the power good signal stay at logic 0 until the power signal has risen to the second voltage level.

The and-gate 215 which passes and delays the power good signal is electrically connected to the output terminal of the or-gate 211 and the delay circuit 219. The delay circuit 219 mainly includes the buffers 213, the delay resistor R7, and the capacitor C1. The delay resistor R7 is electrically connected to the buffers 213 and the and-gate 215, while the capacitor C1 is electrically connected to delay resistor R7 and the and-gate 215. The resistor R7 and the delay capacitor C1 with properly chosen impedances can make the power good signal stay at logic 0 until the power signal has reached the second voltage level.

FIG. 3A shows the truth table of the power good signal according to the present invention. In the truth table, A, B, C and D respectively represent the outputs or the inverse outputs of the four comparators. PGD here still represents the power good signal. Compared with the truth table shown in FIG. 1A, the truth table in FIG. 3A can identify if the voltage level of the power signal is overflow. That is, the power good signal drops back to logic 0 while voltage level of the power signal exceeds the second voltage level. For example, if the second voltage level is 5V, and power signal has risen up to 7 V, the power good signal falls back to logic 0 to indicate that the power signal is not as required.

Similar to the truth table shown in FIG. 1A, when the A, B, C, D equal to 0001/0111, it represents that the power signal has risen to the first voltage/the second voltage level, thus the power good signal is logic 1. The A, B, C, D equal to 0000/0011 represents that the power signal values have not reached the first/second voltage level, thus the power good signal is logic 0. The A, B, C, D equal to 1111 represents that the power signal has exceeded the second voltage level too much, thus the power good signal is logic 0. Other combinations of A, B, C, D are not concerned (don't care; X), and can be set to logic 0 or logic 1 arbitrarily.

FIG. 3B shows the Karnaugh map of the power good signal according to the embodiment of the present invention. In this Karnaugh map, the first column represents the values of A and B, the first row represents the values of and D. Other fields in the Karnaugh map represent the power good signal. To simplify the logic circuit of the power good signal, some Xs (not concerned) in the Karnaugh map are set to logic 1. Therefore, the Boolean function of power good signal (PGD) is $\overline{A}B+\overline{C}D$.

Figure 4:
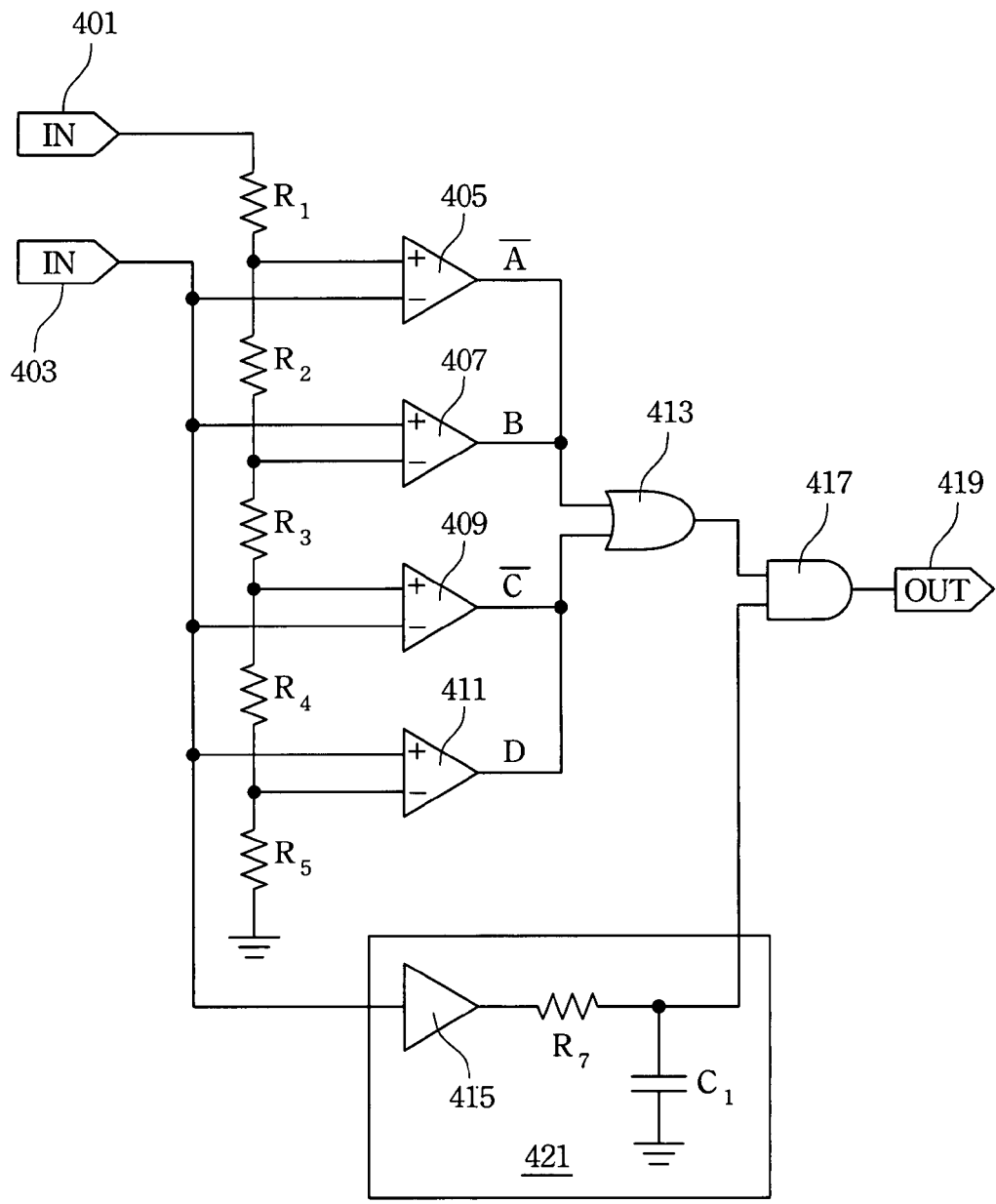
FIG. 4 shows the multi-voltage level detection circuit according to the embodiment of the present invention.

FIG. 4 shows the multi-level voltage detection circuit according to another embodiment of the present invention. The voltage detection circuit includes the reference voltage input port 401, the resistor R1, the resistor R2, the resistor R3, the resistor R4, and the resistor R5. The reference voltage input port 401 imports the reference voltage. The resistors R1, R2, R3, R4, and the resistor R5 are electrically connected serially for dividing the reference voltage, and generating the first voltage level, the second voltage level, the third voltage level and the fourth voltage level.

As shown in FIG. 4, the positive and negative input terminals of the first comparator 405, the second comparator 407, the third comparator 409, and the fourth comparator 411 are electrically connected to the corresponding resistors to compare the first voltage level, the second voltage level, the third voltage level, the fourth voltage level and the power signal, and generate $\overline{A}$, B, $\overline{C}$, D accordingly. The or-gate 413 is electrically connected to the four comparators. If at least one of $\overline{A}$, B, $\overline{C}$, D is logic 1, the or-gate 413 outputs the power good signal of logic 1 and passes the power good signal to the output port 419 for outputting.

Unlike the multi-voltage level detection circuit shown in FIG. 2, when the voltage level of the power signal exceeds the second voltage level with an un-reasonable level, the or-gate 413 outputs the power good signal with logic 0, which acknowledges the mother board that the voltage level of the power signal is out of range.

Similar to FIG. 2, the delay circuit 421 and the and-gate 417 are added in the voltage detection circuit shown in FIG. 4, in order to prevent the motherboard from mistakenly regarding the first voltage level as the second voltage level. The and-gate 417 is electrically connected to the output terminal of the or-gate 413 and the delay circuit 421. The delay circuit 421 substantially includes the buffers 415, the delay resistor R7, and the capacitor C1. The delay resistor R7 is electrically connected to the buffers 415 and the and-gate 417. The capacitor C1 is electrically connected to the delay resistor R7 and the and-gate 417. The delay circuit 421 makes one input of the and-gate 417 stay at logic 0 until the power signal has passed away the first logic level. Then the delay circuit 421 makes the input of the and-gate 417 go to logic 1, thus the power good signal can be passed through the and-gate 417 and transmit to the output port 419. In other words, the and-gate 417 and the delay circuit 421 have delayed the power good signal, and the power signal with first voltage level is not mistakenly regarded as the second voltage level by the motherboard.

According to the above embodiments, the multi-level voltage detection circuit can be applied to the motherboard with multi-level voltage, and is able to detect if the power signal has reached the desired voltage level.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-level voltage detection circuit, comprising:
   a plurality of comparators;
   a plurality of first resistors electrically connected to the comparators;
   a power signal input port electrically connected to the comparators; and
   an or-gate electrically connected to the comparators and having an output terminal outputting a first power good signal according to comparative results of the comparators.

2. The multi-level voltage detection circuit of claim 1, further comprising:
   a delay circuit electrically connected to the power signal input port; and
   an and-gate electrically connected to the output terminal of the or-gate and the delay circuit, wherein the and-gate outputs a second power good signal.

3. The multi-level voltage detection circuit of claim 2, wherein the delay circuit comprises:
   a buffer electrically connected to the power signal input port;
   a second resistor electrically connected to the buffer and the and-gate; and
   a capacitor electrically connected to the second resistor and the and-gate.

4. The multi-level voltage detection circuit of claim 1, further comprising a reference voltage input port electrically connected to the first resistors.

5. A multi-level voltage detection circuit, comprising:
   a resistor circuit including a first resistor, a second resistor, a third resistor, and a fourth resistor electrically connected serially for dividing a reference voltage to generate a first voltage level, a second voltage level and a third voltage level;
   a first comparator electrically connected to the first resistor and the second resistor for comparing an input voltage and the first voltage level;
   a second comparator electrically connected to the second resistor and the third resistor for comparing the input voltage and the second voltage level;
   a third comparator electrically connected to the third resistor and the fourth resistor for comparing the input voltage and the third voltage level; and
   an or-gate electrically connected to the first comparator, the second comparator, and the third comparator, wherein the or-gate generates a first power good signal according to comparing results of the first, the second, and the third comparators.

6. The multi-level voltage detection circuit of claim 5, further comprising:
   a delay circuit; and
   an and-gate electrically connected to the or-gate and the delay circuit, wherein the and-gate generates a second power good signal.

7. The multi-level voltage detection circuit of claim 6, wherein the delay circuit comprises:
   a buffer;
   a delay resistor electrically connected to the buffer and the and-gate; and
   a capacitor electrically connected to the delay resistor and the and-gate.

8. The multi-level voltage detection circuit of claim 5, further comprising:
   a fifth resistor electrically connected to the fourth resistor; and
   a fourth comparator electrically connected to the fourth resistor and the fifth resistor, wherein the fourth comparator compares a fourth voltage level and the input voltage.

* * * * *